United States Patent
Lee et al.

(10) Patent No.: US 10,274,827 B2
(45) Date of Patent: Apr. 30, 2019

(54) SUBSTRATE TREATING APPARATUS AND SUBSTRATE TREATING METHOD

(71) Applicant: SEMES CO., LTD., Chungcheongnam-do (KR)

(72) Inventors: Ki Seung Lee, Chungcheongnam-do (KR); Chang Uk Park, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 15/622,415

(22) Filed: Jun. 14, 2017

(65) Prior Publication Data
US 2017/0371245 A1    Dec. 28, 2017

(30) Foreign Application Priority Data
Jun. 24, 2016  (KR) .................. 10-2016-0079239

(51) Int. Cl.
    *G03F 7/16*     (2006.01)
    *G03F 7/00*     (2006.01)
    *G03F 7/30*     (2006.01)
    *H01L 27/00*    (2006.01)

(52) U.S. Cl.
    CPC ............ *G03F 7/168* (2013.01); *G03F 7/0035* (2013.01); *G03F 7/16* (2013.01); *G03F 7/30* (2013.01); *H01L 27/00* (2013.01)

(58) Field of Classification Search
    None
    See application file for complete search history.

(56) References Cited

U.S. PATENT DOCUMENTS

| 5,633,040 A * | 5/1997 | Toshima | B05D 3/0466 427/335 |
| 5,693,145 A * | 12/1997 | Oikawa | G03F 7/0045 118/50 |
| 2017/0040154 A1* | 2/2017 | Kagawa | H01L 21/0206 |

FOREIGN PATENT DOCUMENTS

| KR | 10-2001-0046452 A | 6/2001 |
| KR | 10-2005-0029802 A | 3/2005 |
| KR | 10-2012-0104953 A | 9/2012 |

* cited by examiner

*Primary Examiner* — Jethro M. Pence
(74) *Attorney, Agent, or Firm* — Li & Cai Intellectual Property (USA) Office

(57) ABSTRACT

A substrate treating apparatus and a substrate treating method are provided. The substrate treating apparatus comprises: a process chamber; a support member positioned in an inner space of the process chamber to support the substrate; an exhaust line provided to communicate with the interior of the process chamber; an exhaust member for providing a suction pressure to the exhaust line; and a controller for controlling the exhaust member when dividing the substrate treating step in which the treating for the substrate is performed into the first treating step and the second treating step, a difference is generated between the pressure that the exhaust member provides to the exhaust line in the first treating step and the pressure that the exhaust member provides to the exhaust line in the second treating step.

4 Claims, 4 Drawing Sheets

SUBSTRATE TREATING APPARATUS AND SUBSTRATE TREATING METHOD

CROSS-REFERENCE TO RELATED APPLICATIONS

This U.S. non-provisional patent application claims priority under 35 U.S.C. § 119 of Korean Patent Application No. 10-2016-0079239, filed on Jun. 24, 2016, the entire contents of which are hereby incorporated by reference.

BACKGROUND OF THE INVENTION

The present disclosure relates to a substrate treating apparatus and a substrate treating method.

Various processes of photolithography, etching, ion implantation, deposition, and cleaning are performed to fabricate semiconductor devices or liquid crystal displays. Among these processes, the photolithography process forms a desired pattern on the substrate.

In the photolithography process, a coating process for applying a chemical solution on a substrate, an exposure process for forming a specific pattern on the coated photoresist film, and a developing process for removing an unnecessary area in the exposed photoresist film are sequentially performed.

SUMMARY OF THE INVENTION

The present disclosure provides a substrate treating apparatus and a substrate treating method for efficiently treating a substrate.

Embodiments of the inventive concept provide a substrate treating apparatus and a substrate treating method capable of shortening the time required for treating a substrate.

Embodiments of the inventive concept provide a substrate treating apparatus and a substrate treating method capable of improving substrate treating quality.

In example embodiment, a substrate treating apparatus comprises: a process chamber; a support member positioned in an inner space of the process chamber to support the substrate; an exhaust line provided to communicate with the interior of the process chamber; an exhaust member for providing a suction pressure to the exhaust line; and a controller for controlling the exhaust member when dividing the substrate treating step in which the treating for the substrate is performed into the first treating step and the second treating step, a difference is generated between the pressure that the exhaust member provides to the exhaust line in the first treating step and the pressure that the exhaust member provides to the exhaust line in the second treating step.

In example embodiment, the support member comprises: a heater for heating the substrate; and a lift pin for supporting the substrate at the time of loading and unloading the substrate, wherein the controller may control the heater to start the operation of the heater while the substrate is being supported by the lift pin in the course of being loaded.

In example embodiment, the controller, in the second treating step, may control the exhaust member such that the main exhaust pressure provided by the exhaust member is larger than the average value of the pressure provided by the exhaust member in the first treating step.

In example embodiment, the controller may control the exhaust member such that the exhaust member provides a secondary exhaust pressure that is less than the main exhaust pressure during the first treating step.

In example embodiment, the controller may control the exhaust member such that the exhaust member increases the pressure after initiating operation to provide a pressure less than a secondary exhaust pressure less than the main exhaust pressure during the first treating step.

In example embodiment, the controller may control the exhaust member such that the pressure provided by the exhaust member reaches the main exhaust pressure when the first treating step is finished and the second treating step is started.

In example embodiment, a substrate treating method comprises: a carrying in step for carrying in a substrate into a process chamber; a first treating step of placing the substrate on a upper surface of a support member located inside the process chamber and having a heater; and a second treating step for heating the substrate places on the upper surface of the support member in a state in which a main exhaust pressure different from the pressure provided in the exhaust line connected to the process chamber in the first treating step is supplied to the exhaust line.

In example embodiment, in the first treating step, an average value of the pressures provided to the exhaust line may be smaller than the main exhaust pressure.

In example embodiment, in the first treating step, a secondary exhaust pressure less than the main exhaust pressure in the exhaust line may be provided.

In example embodiment, the first treating step may increase the pressure provided to the exhaust line after the exhaust line is started with the secondary exhaust pressure less than the main exhaust pressure being provided.

According to an example embodiment, a substrate treating apparatus and a substrate treating method for efficiently treating a substrate may be provided.

According to an example embodiment, a substrate treating apparatus and a substrate treating method capable of shortening the time required for treating a substrate may be provided.

According to an example embodiment, a substrate treating apparatus and a substrate treating method capable of improving substrate processing quality may be provided.

BRIEF DESCRIPTION OF THE DRAWINGS

FIG. 4 is a view showing a state in which a substrate is carried in.

DETAILED DESCRIPTION

Various example embodiments will be described more fully hereinafter with reference to the accompanying drawings, in which some example embodiments are shown. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
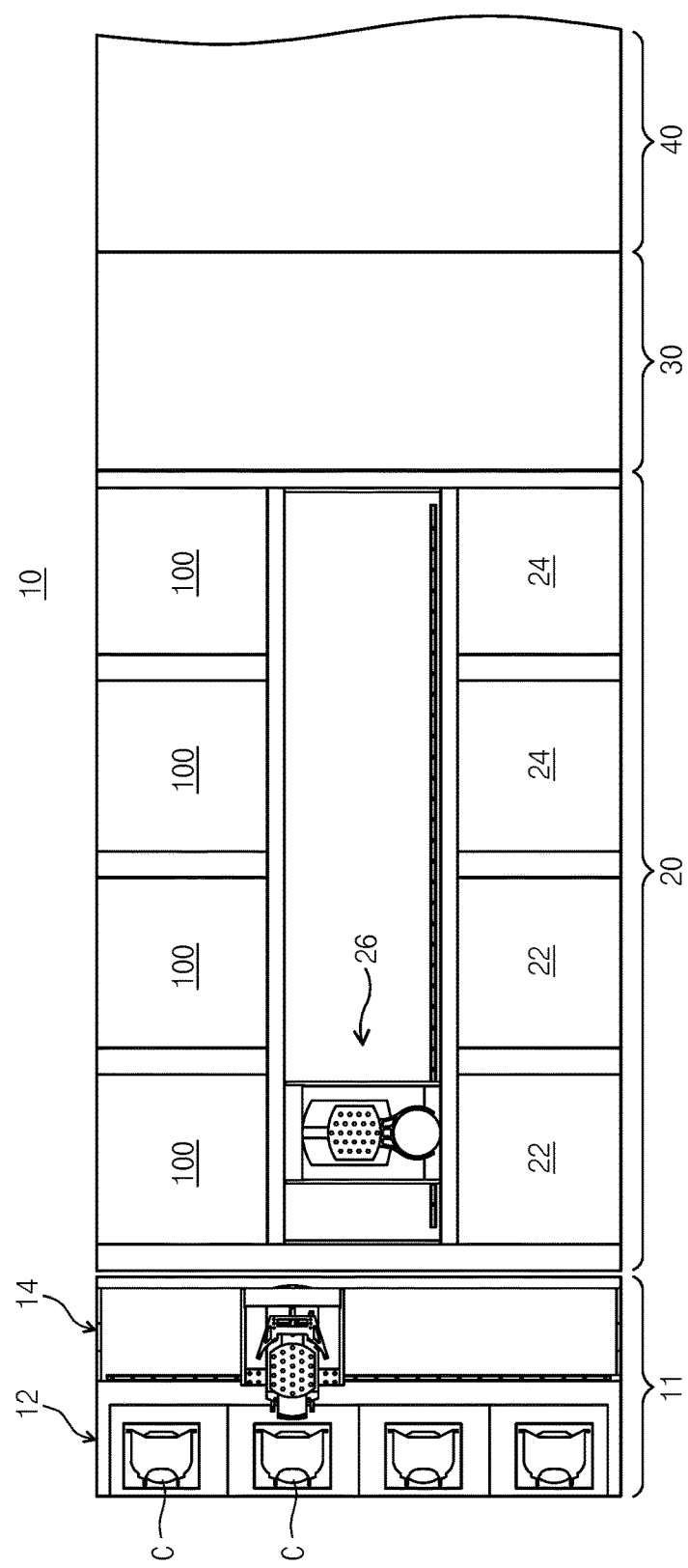
FIG. 1 is a plan view of a substrate treating apparatus according to an embodiment of the present invention.

FIG. 1 is a plan view of a substrate treating apparatus according to an embodiment of the present invention.

The substrate treating apparatus 10 may continuously treat a coating process, an exposure process, and a developing process. Referring to FIG. 1, the substrate treating apparatus 10 includes an indexer unit 11, a processing unit 20, an interface unit 30, and an exposure process unit 40.

The indexer unit 11 includes a load port 12 and a transfer unit 14. The load port 12 has a rod portion on which a cassette C accommodating a plurality of substrates is placed. The transfer unit 14 is disposed between the load port 12 and the processing unit 20 and transfers the substrate between the cassette C and the processing unit 20 located in the load port 12.

The processing unit 20 performs a substrate treating process. Here, the substrate treating step includes a coating process, a baking process, and a developing process. For this, the processing unit 20 includes a coating unit 22, a developing unit 24, and a bake unit 100. The coating unit 22 coats a photosensitive liquid onto the substrate. The developing unit 24 develops the substrate by supplying the developing liquid to the substrate on which the photosensitive liquid film is formed. Then, the bake unit 100 heats the substrate to a predetermined temperature. The processing unit 20 includes at least one transfer robot 26. The transfer robot 26 transfers the substrates between the respective units 22, 24, and 100.

The interface unit 30 transfers the substrate between the processing unit 20 and the exposure process unit 40, and the exposure process unit 40 performs an exposure process for forming a pattern required in the process on the substrate transferred from the interface unit 30. As the exposure process unit 40, an exposure process apparatus such as a stepper for performing the exposure process may be used.

Figure 2:
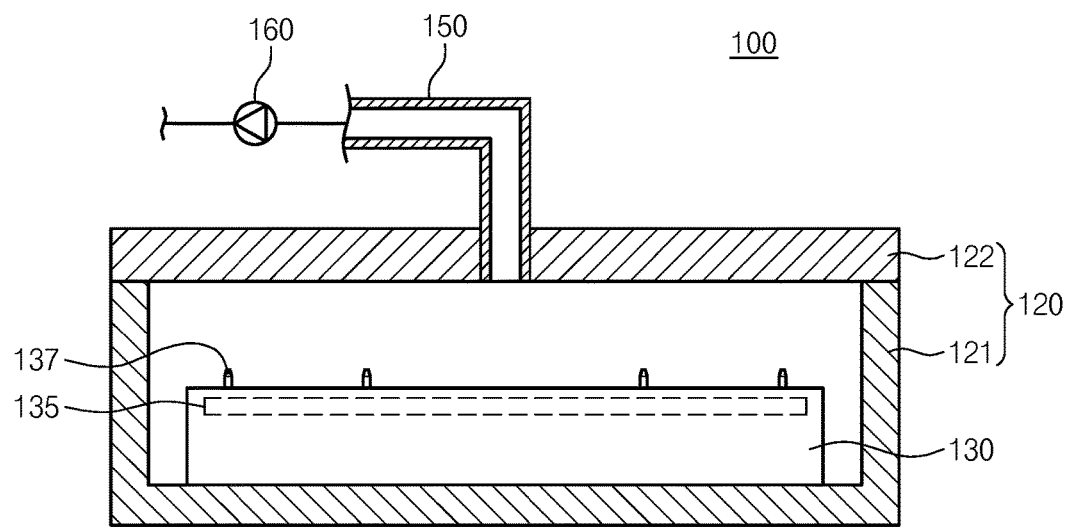
FIG. 2 is a view showing a bake unit according to an embodiment of the present invention.

FIG. 2 is a view showing a bake unit according to an embodiment of the present invention.

Figure 3:
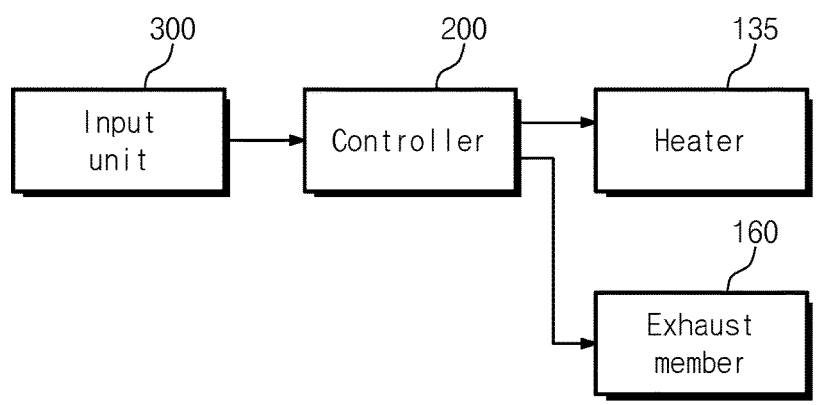
FIG. 3 is a view showing the control relationship of the exhaust member and the heater.

Referring to FIGS. 2 and 3, the bake unit 100 includes a process chamber 120, a support member 130, an exhaust line 150, and a controller 200.

The process chamber 120 forms an inner space in which the substrate is treated. The process chamber 120 may have a shape corresponding to the shape of the substrate to be treated in the bake unit 100. For example, if the substrate is for manufacturing semiconductor device, the process chamber 120 may be provided in a cylindrical shape. In addition, the substrate may be provided in a hexahedral form if it is for manufacturing liquid crystal display. Hereinafter, the case where the substrate is for manufacturing a semiconductor device will be described as an example. However, the present invention may also be applied to a substrate treatment for manufacturing a liquid crystal display.

The process chamber 120 includes a first housing 121 and a second housing 122. The first housing 121 may be provided in a cylindrical shape with its upper side opened. The second housing 122 may be provided in a cylindrical or plate shape with its lower side opened corresponding to the opened upper side of the first housing 121.

When the second housing 122 is located on the opened upper side of the first housing 121, the inner space formed by the first housing 121 and the second housing 122 is sealed. The second housing 122 is provided movably up and down. The substrate in the inner space is carried out or the substrate is carried in from the outside into the inner space in a state in which the second housing 122 is moved upwardly away from the upper surface of the first housing 121. When the substrate to be treated is brought into the inner space, the second housing 122 is positioned on the upper surface of the first housing 121 to shield the inner space. The second housing 122 is positioned on the upper side of the first housing 121 after the substrate is transferred to the process chamber 120 with the second housing 122 being spaced apart from the first housing 121.

The support member 130 is located in the inner space of the process chamber 120. The support member 130 may be provided with an area larger than that of the substrate when viewed from above. The support member 130 is provided in a disc shape or a polygonal shape, and is fixed to the first housing 121. The substrate loaded into process chamber 120 is located in support member 130.

The support member 130 is provided with a heater 135. The heater 135 is provided so as to be heat-exchangeable with the support member 130. The heater 135 is installed inside the support member 130 or in contact with the lower surface of the support member 130. When the heater 135 operates, heat generated in the heater 135 is conducted to the substrate, and the substrate is heated. The controller 200 may control on/off of the heater 135. In addition, the controller 200 may control the length of the operation time of the heater 135.

On the upper surface of the support member 130, lift pins 137 may be provided. The lift pin 137 is provided so as to be elevated. The lift pins 137 may support the substrate at a distance from the upper surface of the support member 130 during the process of carrying in the substrate into and out of the process chamber 120.

The exhaust line 150 is provided to communicate with the interior of the process chamber 120. In one example, the exhaust line 150 is connected to the second housing 122. The exhaust line 150 may be connected to an exhaust member 160 that provides suction pressure. Gases or fumes within the process chamber 120 may be vented through the exhaust line 150. The controller 200 may control on/off of the exhaust member 160. Further, the controller 200 may control the operation time of the exhaust member 160. In addition, the controller 200 may adjustably provide the magnitude of the suction pressure that the exhaust member 160 provides to the interior of the process chamber 120. The controller 200 may be connected to the input unit 300. The user may change the condition for the controller 200 to control the heater 135 through the input unit 300. In addition, the user may change the condition for the controller 200 to control the exhaust member 160 through the input unit 300.

Figure 4:
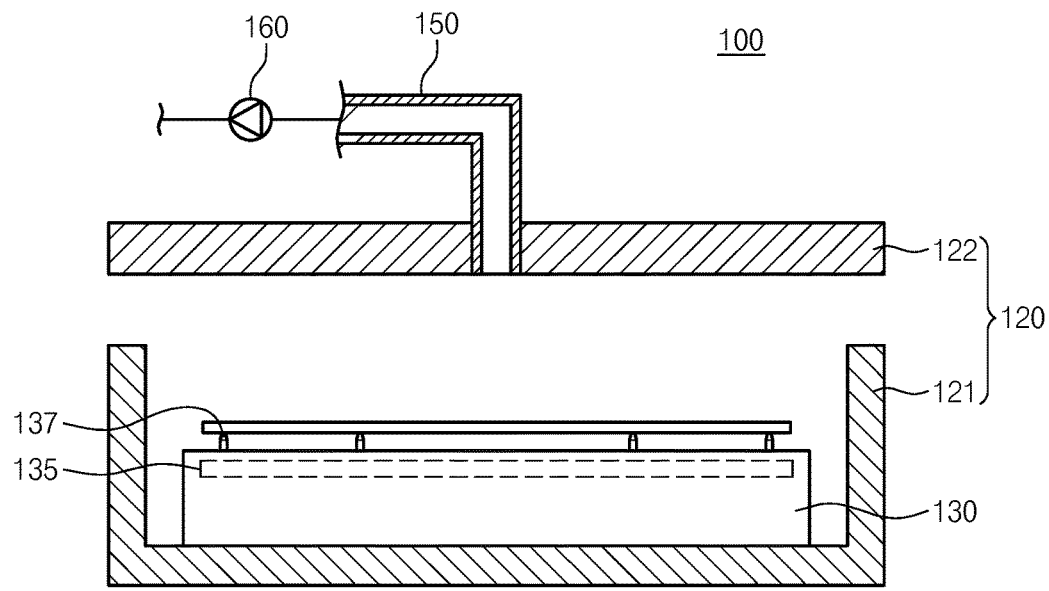
Figure 5:
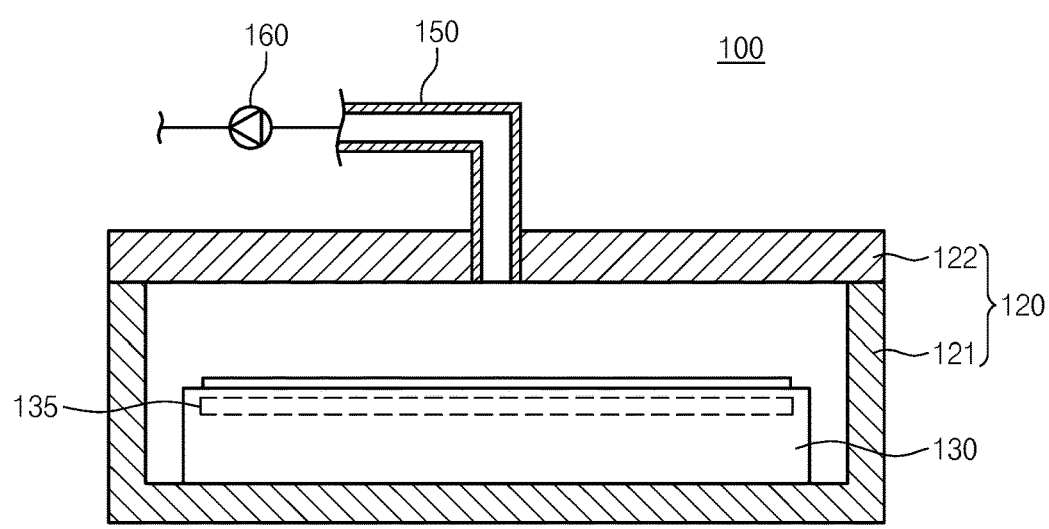
FIG. 5 is a view showing a state in which the substrate is treated.

FIG. 4 is a view showing a state in which a substrate is carried in. FIG. 5 is a view showing a state in which the substrate is treated.

Referring to FIG. 4, the substrate is carried into the process chamber 120 when the second housing 122 is raised and the process chamber 120 is in an open state. At this time, the lift pin 137 is provided in an elevated state to support the substrate to be loaded. When the substrate is in the loaded state, the exhaust member 160 may be in an on state or an off state.

When the carrying in of the substrate is completed, the second housing 122 is lowered to shield the process chamber 120. The lift pins 137 may support the substrate in an elevated state while the process chamber 120 is shielded. The heater 135 may initiate operation while the substrate is being carried in. The heater 135 may also initiate operation while the second housing 122 shields the process chamber 120 with the substrate held by the lift pins 137 before the second housing 122 starts to descend, or when the substrate is supported by the lift pins 137. As the heater 135 starts operating, the temperature of the support member 130 rises. The heat transfer between the heater 135 and the support member 130 is balanced so that it takes time for the support member 130 to reach the processing temperature for substrate treatment. When the substrate is loaded or while the process chamber 120 is being shielded, the time required for the support member 130 to reach the process temperature after the start of the substrate is carried in by the heating of the support member 130 by the heater 135 may be shortened. The exhaust member 160 may be in the off state or may be operating in a state of supplying the preparation pressure to the exhaust line 150 while the substrate is carried and the process chamber 120 is shielded.

After the set time has elapsed after the shielding of the process chamber 120, the lift pin 137 is lowered, and the substrate treating step with the heated support member 130 is started. When the set time has elapsed, the support member 130 may be a process temperature or a state close to the process temperature. The exhaust member 160 operates in two different ways during the substrate treating step.

The exhaust member 160 may be in the off state or may be operating in the state of providing the secondary exhaust pressure to the exhaust line 150 when the first treating step is started according to the start of the substrate treatment. The secondary exhaust pressure may be equal to or close to the ready pressure. In one example, the exhaust member 160 may be in the off state until the substrate treatment is started in the course of the substrate being carried. Further, the exhaust member 160 may initiate to provide the secondary exhaust pressure when the substrate is carried in, the process chamber 120 is in the off state while being shielded, and the substrate treatment is started. The exhaust member 160 also may be off when the substrate is carried in, the process chamber 120 is operated to provide a ready pressure while being shielded, and when the substrate treatment is started. The exhaust member 160 may also initiate to provide the secondary exhaust pressure when the substrate is carried in, the process chamber 120 is operated to provide a ready pressure while being shielded, and when the substrate treatment is started.

When the set time has elapsed after the first treating step is started, the second treating step is started. The exhaust member 160 provides the main exhaust pressure to the exhaust line 150 in the second treating step. The main exhaust pressure is provided to be larger than the average value of the pressure provided by the exhaust member 160 in the first treating step. Further, the main exhaust pressure is provided larger than the secondary exhaust pressure. As an example, the exhaust member 160 may be in the off state in the first treating step and may be operable to provide the main exhaust pressure in the second treating step. Further, the exhaust member 160 may be brought to the main exhaust pressure when the second treating step is started by increasing the pressure after starting the operation to provide the secondary exhaust pressure in the first process step. And may provide a main exhaust pressure during the second treating step. In addition, the exhaust member 160 may be operable to provide an secondary exhaust pressure during the first treating step and to provide a main exhaust pressure during the second treating step.

Figures 6, 7:
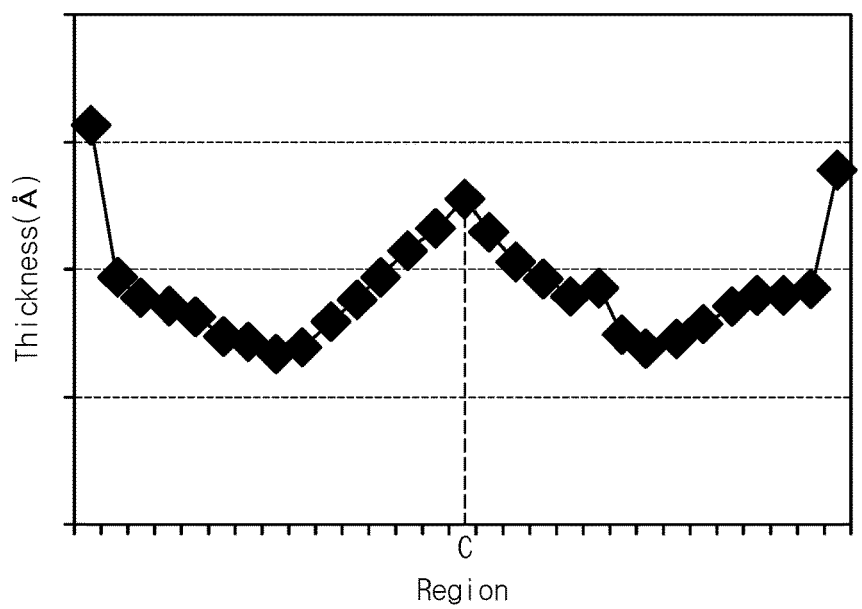
FIG. 6 is a view showing the film thickness of a substrate treated in a process chamber in which exhaust is performed at a constant pressure during a substrate treating step.
FIG. 7 is a view showing the film thickness of a substrate treated in a process chamber in accordance with the present invention.

FIG. 6 is a view showing the film thickness of a substrate treated in a process chamber in which exhaust is performed at a constant pressure during a substrate treating step. FIG. 7 is a view showing the film thickness of a substrate treated in a process chamber in accordance with the present invention.

Referring to FIG. 6, it can be seen that there is a large variation in the film thickness for each region of the substrate. It was confirmed that such a film thickness deviation is caused by a difference in pressure between the portion of the process chamber where the exhaust line is connected and the periphery thereof, an exhausted gas and the force generated by the fume on the top surface of the substrate.

Referring to FIG. 7, it can be seen that the substrate treated in the process chamber 120 according to the present invention is uniformly formed in the outward direction at the center C of the substrate. The substrate is treated in a state in which the average value of the pressures in the first treating step is smaller than the main exhaust pressure. Therefore, the influence of the pressure difference in each region in the process chamber 120 and the influence of the exhaust gas and the gas flow by the fume on the substrate are reduced. Further, the fumes are mainly generated by a solvent or the like vaporized in the liquid of the substrate by heating the substrate. Accordingly, when the set time after the start of the substrate treating has elapsed, the pressure is raised to the main exhaust pressure and the fume is effectively discharged. Further, when exhaust is performed at the main exhaust pressure, the substrate is in a state of being treated for the set time, so the pressure difference due to the region and the influence of the gas and fume discharged air are reduced.

Foregoing embodiments are examples of the present invention. Further, the above contents merely illustrate and describe preferred embodiments and embodiments may include various combinations, changes, and environments. That is, it will be appreciated by those skilled in the art that substitutions, modifications and changes may be made in these embodiments without departing from the principles and spirit, the scope of which is defined in the appended claims and their equivalents. Further, it is not intended that the scope of this application be limited to these specific embodiments or to their specific features or benefits. Rather, it is intended that the scope of this application be limited solely to the claims which now follow and to their equivalents.

What is claimed is:

1. A substrate treating method comprising:
   a carrying in step for carrying in a substrate into a process chamber;
   a first treating step of placing the substrate on a upper surface of a support member located inside the process chamber and having a heater; and
   a second treating step for heating the substrate placed on the upper surface of the support member in a state in which a main exhaust pressure larger than a pressure provided in an exhaust line connected to the process chamber in the first treating step is supplied to the exhaust line,
   wherein a preparation pressure approximately equal to the pressure provided in the first treating step is supplied to the exhaust line in the carrying in step.

2. The method of claim 1, wherein in the first treating step, an average value of the pressures provided to the exhaust line is smaller than the main exhaust pressure.

3. The method of claim 1, wherein in the first treating step, a secondary exhaust pressure less than the main exhaust pressure in the exhaust line is provided.

4. The method of claim 1, wherein the first treating step increases the pressure provided to the exhaust line after the exhaust line is started with a secondary exhaust pressure less than the main exhaust pressure being provided.

\* \* \* \* \*